United States Patent [19]
Tran et al.

[11] Patent Number: 5,780,883
[45] Date of Patent: Jul. 14, 1998

[54] GATE ARRAY ARCHITECTURE FOR MULTIPLEXER BASED CIRCUITS

[75] Inventors: Dzung Joseph Tran; Mark Warren Acuff, both of Hillsboro, Oreg.

[73] Assignee: TransLogic Technology, Inc., Beaverton, Oreg.

[21] Appl. No.: 808,249

[22] Filed: Feb. 28, 1997

[51] Int. Cl.$^6$ ............................................. H01L 27/10
[52] U.S. Cl. ............................................ 257/206; 257/204
[58] Field of Search ........................... 257/202, 204, 257/206

[56] References Cited

U.S. PATENT DOCUMENTS

| | | | |
|---|---|---|---|
| 4,602,270 | 7/1986 | Finegold et al. | 257/204 |
| 5,055,716 | 10/1991 | El Gamel | 307/446 |
| 5,162,666 | 11/1992 | Tran | 307/243 |
| 5,164,811 | 11/1992 | Tamura | 257/206 |
| 5,187,556 | 2/1993 | Nariishi et al. | 257/206 |
| 5,289,021 | 2/1994 | El Gamel | 257/296 |
| 5,313,079 | 5/1994 | Brasen et al. | 257/206 |
| 5,343,058 | 8/1994 | Shiffer, II | 257/204 |
| 5,391,943 | 2/1995 | Mahant-Shetti et al. | 326/41 |
| 5,404,034 | 4/1995 | Yin | 257/206 |
| 5,420,447 | 5/1995 | Waggoner | 257/206 |
| 5,422,581 | 6/1995 | Mahant-Shetti et al. | 326/50 |
| 5,436,485 | 7/1995 | Shikatani et al. | 257/204 |
| 5,488,238 | 1/1996 | Enraku et al. | 257/204 |
| 5,581,202 | 12/1996 | Yano et al. | 326/101 |

OTHER PUBLICATIONS

Weste et al., "CMOS Domino Logic," Chap. 5, *Principles of CMOS VLSI design: a systems perspective*, Library of Congress, 2nd ed., pp. 407–413 (1993).

*Primary Examiner*—Ngân V. Ngô
*Attorney, Agent, or Firm*—Klarquist Sparkman Campbell Leigh & Whinston, LLP

[57] ABSTRACT

A gate array architecture adapted for circuits containing transmission gates. In one embodiment, the gate array architecture contains a base row having at least four alternating P- and N-channel transistor rows. The transistor rows are positioned between a first voltage and a second voltage rail. In another embodiment, the rows adjacent the first and second voltage rails have larger transistors to facilitate connection of the transistors as inverters or buffers. The rows more remotely positioned from the first and second voltage rails have smaller transistor sizes to facilitate connection of the transistors as transmission gates. The gate array architecture is particularly efficient when used to create serial multiplexer-based circuits.

16 Claims, 8 Drawing Sheets

- Vdd Rail 50
- P Diffusion Strip 42
- N Diffusion Strip 44
- P Diffusion Strip 46
- N Diffusion Strip 48
- Vss Rail 52
- 54

FIG. 3B

- Vdd Rail 58
- P Diffusion Strip 56
- N Diffusion Strip 64
- P Diffusion Strip 66
- N Diffusion Strip 60
- Vss Rail 62

GATE ARRAY ARCHITECTURE FOR MULTIPLEXER BASED CIRCUITS

FIELD OF THE INVENTION

This invention relates generally to integrated circuits, and, more particularly, relates to a gate array architecture used to produce integrated circuits.

BACKGROUND OF THE INVENTION

Gate arrays are frequently used to create Application Specific Integrated Circuits (ASIC) in a short period of time. Gate-arrays are typically stocked by a vendor in the form of master or base wafers containing a silicon die of unconnected transistors. A circuit designer provides a design-specific circuit to a vendor in the form of a netlist, which calls out the desired transistor-to-transistor interconnects in the circuit. The vendor then interconnects the transistors as specified by the netlist using metal masks. The masks interconnect transistors to form base components, such as AND, OR or NOR gates, and interconnect the base components together to form the design-specific circuit. Wiring between rows of transistors may occur over the top of unused transistors, as in a "sea-of-gates" type gate array, or may be constrained to routing channels between transistors, as in more conventional gate arrays. The resulting integrated circuit is semi-custom in that a designer has no control over the size or layout of the unconnected transistors in the master wafer, but can control the interconnection between transistors to create a custom function.

Gate arrays minimize the cost of integrated circuits because a high volume of identical master wafers may be manufactured and used for many different designs. Additionally, only two to five metal masks need to be generated to create a design-specific circuit, which also minimizes cost and allows vendors to provide quick turn-around from delivery of a netlist to completion of an ASIC.

Most gate array architectures use equal-sized transistors for ease of fabrication and for making the architecture adaptable to a wide variety of circuit designs. The absolute size of transistors is a trade-off between drive capability, loading and the array density required. Some architectures, however, use varying-size transistors to increase efficiency for specific circuit designs, such as the architectures disclosed in U.S. Pat. Nos. 5,289,021 and 5,055,716, both to El Gamel.

Figure 1A:
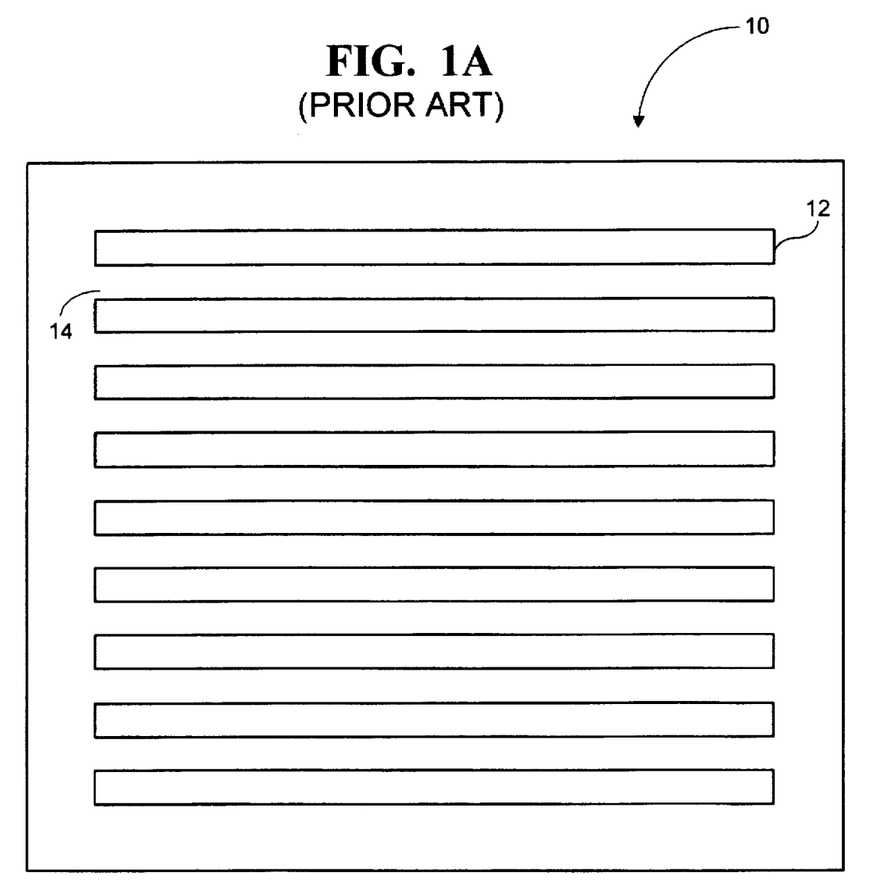
FIG. 1A is a schematic diagram of gate array architecture having multiple base rows.
Figure 1B:
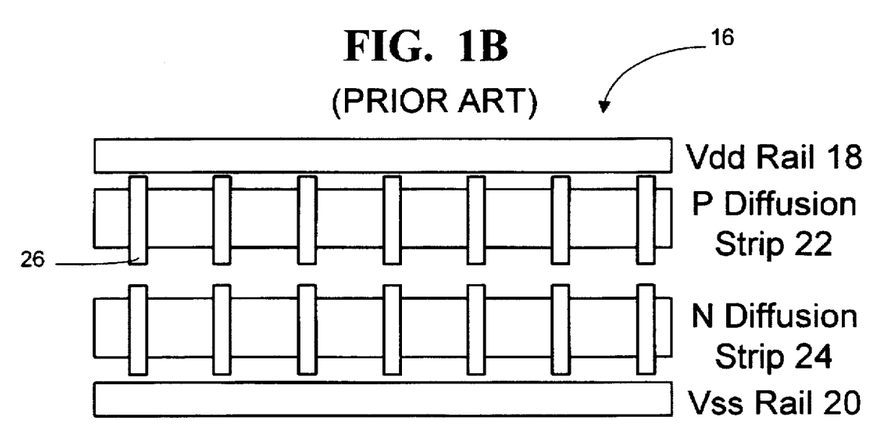
FIG. 1B is an enlarged diagram of a known base row type that may be used in the gate array architecture of FIG. 1A.

FIG. 1A shows a typical gate array architecture 10. The gate array architecture includes a plurality of base rows 12 with routing channels 14 between the base rows. FIG. 1B is an enlarged illustration of a typical base row type 16 that includes voltage rails 18 and 20 and diffusion strips 22 and 24. Rail 18 is a Vdd rail (e.g., positive voltage) and rail 20 is a Vss rail (e.g., ground). P-type diffusion strip 22 and N-type diffusion strip 24 are located between the voltage rails 18, 20. Polysilicon gates, such as a gate 26, cross the P- and N-type diffusion strips 22, 24 to form a continuous horizontal row of unconnected P- and N-channel transistors. Because the base rows 12 are repeated (as shown in FIG. 1A), the gate array architecture contains an array of unconnected transistors.

The base row type shown in FIG. 1B is believed to be the most widely used in gate array architectures. The base row type includes only one row of P-channel and N-channel transistors between the voltage rails 18, 20. Consequently, the transistors are always positioned adjacent to the voltage rails. Since most logic gates (e.g., AND, OR, NOR, XOR gates) contain transistors that are connected to the voltage rails, this base row type allows the shortest possible lead lines.

Figure 2:
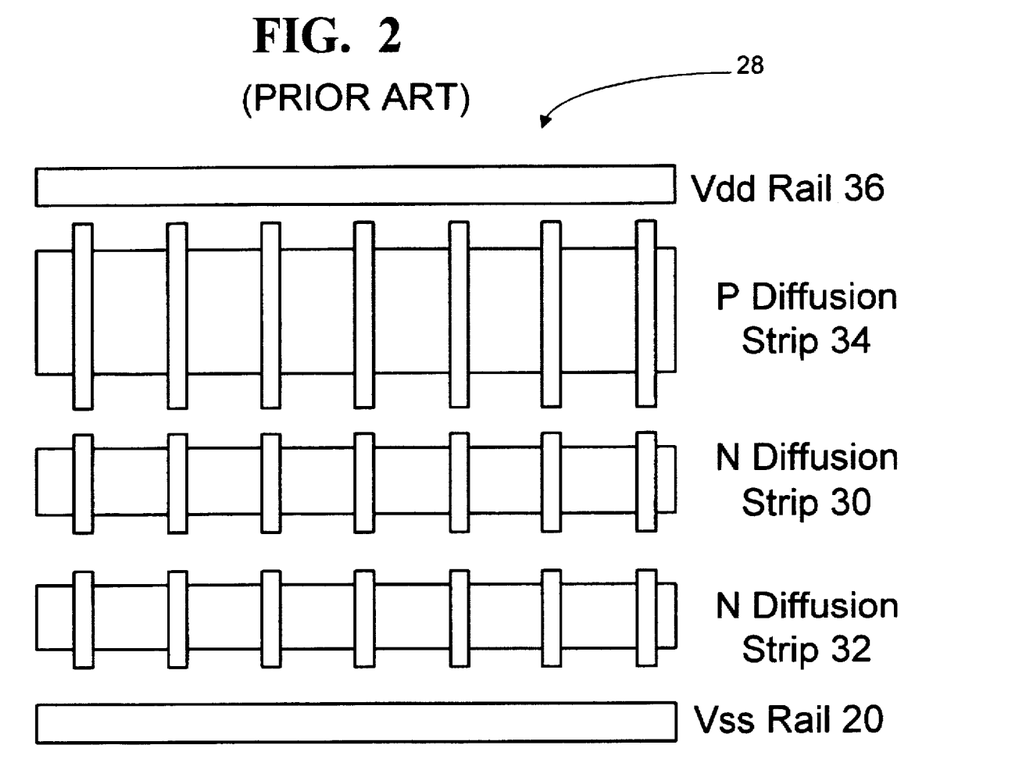
FIG. 2 is an enlarged diagram of a known base row type that may be used in the gate array architecture of FIG. 1A with two N-type diffusion strips and a single P-type diffusion strip.

FIG. 2 is an illustration of another known base row type 28 used in gate array architectures. A base row of this type includes two N-type diffusion strips 30, 32. The base row type 28 also includes a P-type diffusion strip 34 positioned adjacent to voltage rail 36. Circuit designers have found that the FIG. 2 architecture is more efficient in the implementation of memories and dynamic logic. The transistor sizes are typically smaller than in the FIG. 1B configuration because more transistors must be packed into the same die area.

In the FIG. 2 architecture, when designers require a transistor with more power, prior articles teach that it is much more efficient to connect two transistors in parallel, rather than making the transistors physically larger. See "A Highly Flexible Sea-of-Gates Structure for Digital and Analog Application," *IEEE Journal of Solid-State Circuits*, Vol. 24, No. 3 (June 1989). To connect transistors on two different diffusion strips in parallel, it is desirable to have the two N-type diffusion strips adjacent to each other. This way, when connecting a transistor in one row in parallel with a transistor in the adjacent row, the lead lines between the rows is as short as possible. Short lead lines increase the speed of the circuit and reduce the area required. For example, a transistor in strip 30 can be coupled in parallel with a transistor in strip 32 using very short lead lines.

There are some disadvantages to gate array architectures. For example, these architectures have a utilization factor (the number of gates that may be used divided by the total number of gates) of only 40 to 50 percent. Additionally, these architectures tend to have long interconnect lines within and between components which increases the parasitic capacitance and, consequently, increases the propagation delay of the circuit. Transistor sizes are also dictated by the master wafer, rather than using the optimal size for a given component. These disadvantages underscore the need for more efficient gate array architectures.

Prior gate array architectures have worked well for implementing circuits containing standard components, such as AND, OR, or NOR gates. But they are not readily adaptable to recently developed circuit components, such as the serial multiplexers disclosed in U.S. Pat. No. 5,162,666 to Tran. These gate array architectures, when containing serial multiplexer-based circuits, leave many gates unutilized. Many transistors are either too big or too small to be used efficiently by the serial multiplexers. And where the transistors are used, they require long metal interconnect lines that produce high capacitance and, consequently, longer propagation delays.

More recently developed serial multiplexer circuits use transmission gates. Transmission gates are a combination of one P-channel transistor and one N-channel transistor coupled in parallel. The base row type shown in FIG. 1B is particularly inefficient for circuits containing a large number of transmission gates. Unlike standard components (e.g., AND, OR, and NOR gates), transmission gates do not require connection to the voltage rails. Transmission gates also use smaller transistors than standard components. Consequently, transistors sized for a base row type of FIG. 1B are too large for transmission gates and, therefore, waste valuable area.

An objective of the invention, therefore, is to provide a gate array architecture that allows circuits using transmission gates to be implemented efficiently. A further objective of the invention is to provide such an architecture that allows for efficient implementation of serial multiplexer circuits, especially those that include transmission gates.

SUMMARY OF THE INVENTION

The present invention provides a master wafer, gate array architecture adapted for transmission gate-based circuits.

The gate array architecture is particularly adapted to serial multiplexer circuits that include transmission gates.

In one aspect of the present invention, the master wafer, gate array architecture contains a base row type having at least four rows of transistors between voltage rails. The rows alternate between P-channel transistors and N-channel transistors for optimizing circuits designed using transmission gates. The transmission gates themselves are merely switches and are not generally coupled to power. Thus, having transmission gates coupled more remotely from the voltage rails does not compromise efficiency.

In a second aspect of the invention, the rows of transistors are different sizes with inner rows (rows more remote from the voltage rails) having smaller sized transistors and outer rows (rows adjacent the voltage rails) having larger sized transistors. The smaller transistors are more efficiently used for transmission gates, whereas the larger transistors are more efficiently used for buffers, such as inverters.

The gate array architecture, according to the invention, uses minimal area and maximizes speed of transmission gate-based circuits because at least two rows of transistors in the base row are sized and positioned for connection as transmission gates. At least two other rows are positioned adjacent the voltage rails and are specifically sized and positioned for connection as standard components, such as AND, OR, inverters, and buffers.

These advantages and other advantages and features of the inventions will become apparent from the following description of a preferred embodiment, which proceeds with reference to the following drawings.

DETAILED DESCRIPTION OF PREFERRED EMBODIMENTS

Figure 3A:
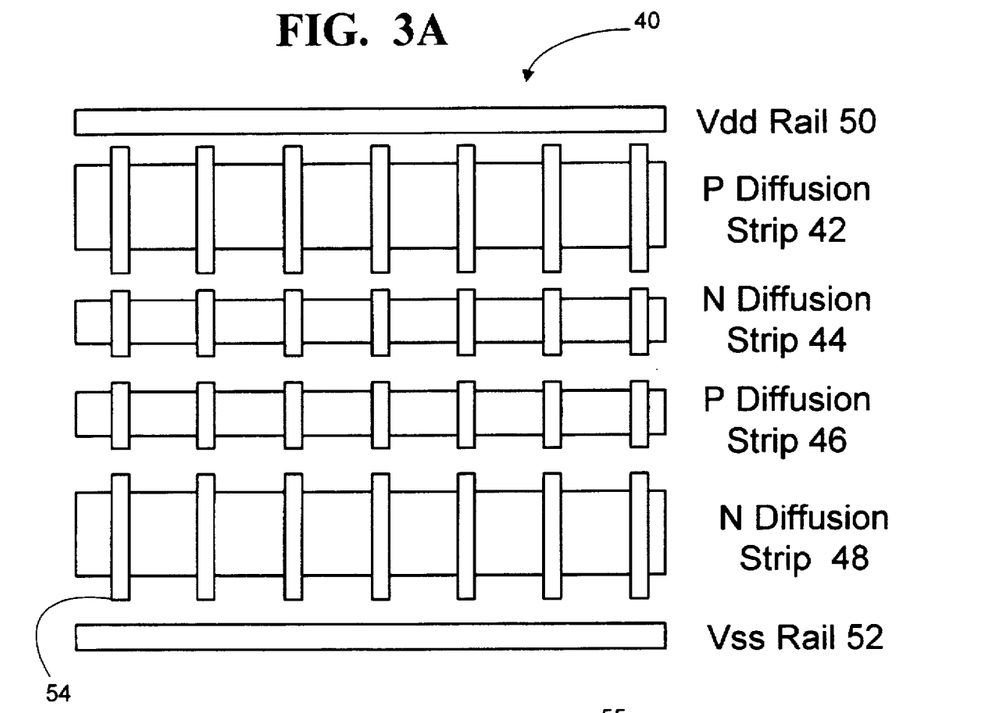
FIG. 3A is an enlarged diagram of a base row type according to the invention that may be used in the gate array architecture of FIG. 1A having alternating P-type and N-type diffusion strips between voltage rails.

FIG. 3A shows a type of base row 40 according to the invention. The base row includes four diffusion strips 42, 44, 46 and 48 positioned between voltage rails 50 and 52. Voltage rail 50 is a Vdd rail, which is typically coupled to a positive voltage supply, such as 5 volts. Voltage rail 52 is a Vss rail, which is typically coupled to ground. Diffusion strips 42, 48 are called outer diffusion strips because they are located adjacent to the voltage rails. Specifically, diffusion strip 42 is a P-type diffusion strip located adjacent to the Vdd rail, while diffusion strip 48 is an N-type diffusion strip positioned adjacent to the Vss rail.

Diffusion strips 44, 46 are called inner diffusion strips because they are more remotely positioned from the voltage rails than the outer diffusion strips 42, 48. Inner diffusion strip 44 is an N-type diffusion strip and is positioned between diffusion strips 42 and 46. Inner diffusion strip 46 is a P-type diffusion strip and is positioned between diffusion strips 44 and 48. Polysilicon gates, shown generally as 54, cross all of the diffusion strips 42, 44, 46, and 48 to form two rows of P-channel transistors and two rows of N-channel transistors.

The diffusion strips 42, 44, 46 and 48 alternate between P-type and N-type diffusions to provide a base row configuration of P-N-P-N. The P-type diffusion strip 42 is positioned closest to Vdd because P-channel transistors are typically connected to the Vdd rail. Similarly, the N-type diffusion strip 48 is positioned adjacent the Vss rail because N-channel transistors are typically connected to the Vss rail.

Prior gate array architectures frown on having inner rows of transistors because wires from the inner transistors need to be routed over the outer diffusion strips 42 and 48 in order to access the voltage rails. The extra distance required to connect the inner transistors to the voltage rails increases the area used by a circuit and slows the speed of the circuit. Some gate array architectures do, however, contain an inner row, particularly in memory or dynamic logic circuits. When an inner row is used, it is desirable to have the same type diffusions adjacent each other. For example, it is desirable to have a P-N-N configuration, as is shown in FIG. 2. This allows short lead lines when larger transistors are created from a parallel combination of smaller transistors. Thus, the alternating configuration of base row type 40 (FIG. 3A) contradicts conventional thinking in gate array architectures.

The base row type 40 has been found, however, to be ideal for transmission gate-based circuits. Transmission gates have at least one N-channel and one P-channel transistor interconnected in parallel. The alternating P-channel and N-channel transistor rows used in the base row 40 allow short lead lines when connected as transmission gates, thus conserving valuable chip area and increasing the speed of the circuit.

Transmission gates are designed to efficiently pass a signal from an input terminal to an output terminal when the transmission gate is activated. Transmission gates are typically not connected to the Vdd and Vss rails, as are standard components (e.g., AND, OR, and NOR gates). As a result, creating transmission gates using inner rows does not degrade performance or increase the area used because such gates do not need long lead lines connected to the voltage rails.

The inner diffusion strips 44 and 46 are narrower than the outer diffusion strips 42 and 48 to indicate that the inner-row transistors are smaller than the outer-row transistors. With standard components, such as AND, OR, NOR and inverters, the larger the transistor, the faster the gate. With transmission gates, however, because of RC effects, a larger transistor does not translate into increased performance. Smaller transistors are, consequently, preferable for transmission gates to save area.

The outer diffusion strips 42 and 48 are made larger to implement standard components. Standard components require connection to the voltage rails and, consequently, are conveniently positioned adjacent thereto. The lead lines from transistors formed on the outer strips to the voltage rails are as short as possible, saving area and increasing the speed of the circuit.

Figure 3B:
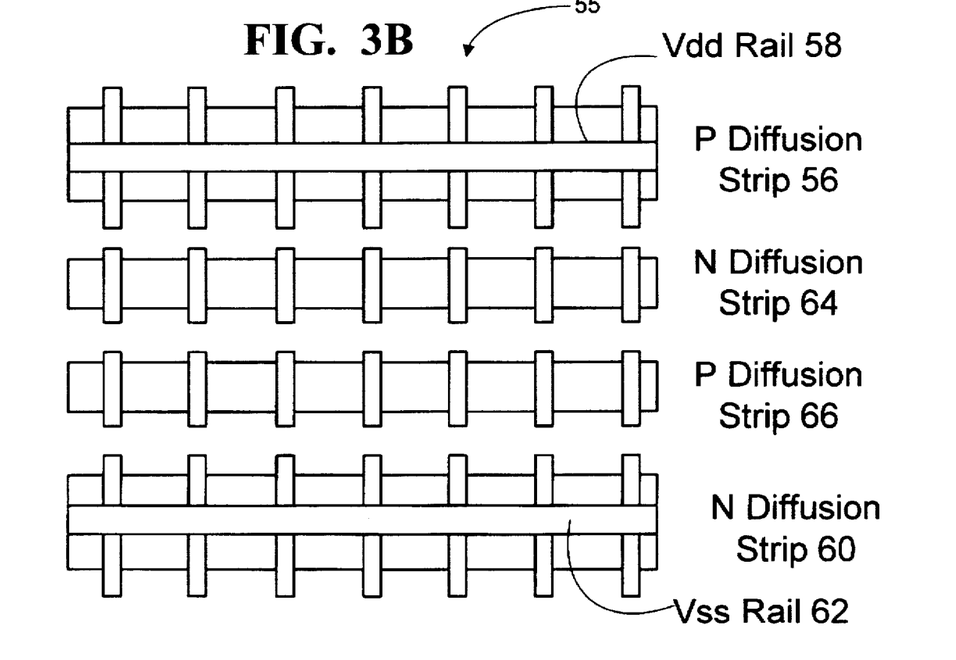
FIG. 3B is an enlarged diagram of a base row type that may be used in the gate array architecture of FIG. 1A with voltage rails positioned on top of the outermost diffusion strips.

FIG. 3B shows a similar configuration to that of FIG. 3A, with a base row type 55 having alternating P-type and N-type diffusion strips. The outer diffusion strip 56 is a P-type diffusion strip with a Vdd rail 58 running over the top of the transistors, but isolated therefrom. Similarly, an N-type diffusion strip 60 is an outer strip with a Vss rail 62 running over the top of the transistors, but isolated therefrom. This configuration has all the advantages of the base row 40 described in FIG. 3A but, additionally, has the voltage rails positioned closer to transistors on inner diffusion strips 64 and 66 to facilitate connection between the inner strips and the voltage rails.

Although both FIGS. 3A and 3B are shown with varying-size transistor strips, the transistor strips can all be equally sized, if desired.

Figure 4:
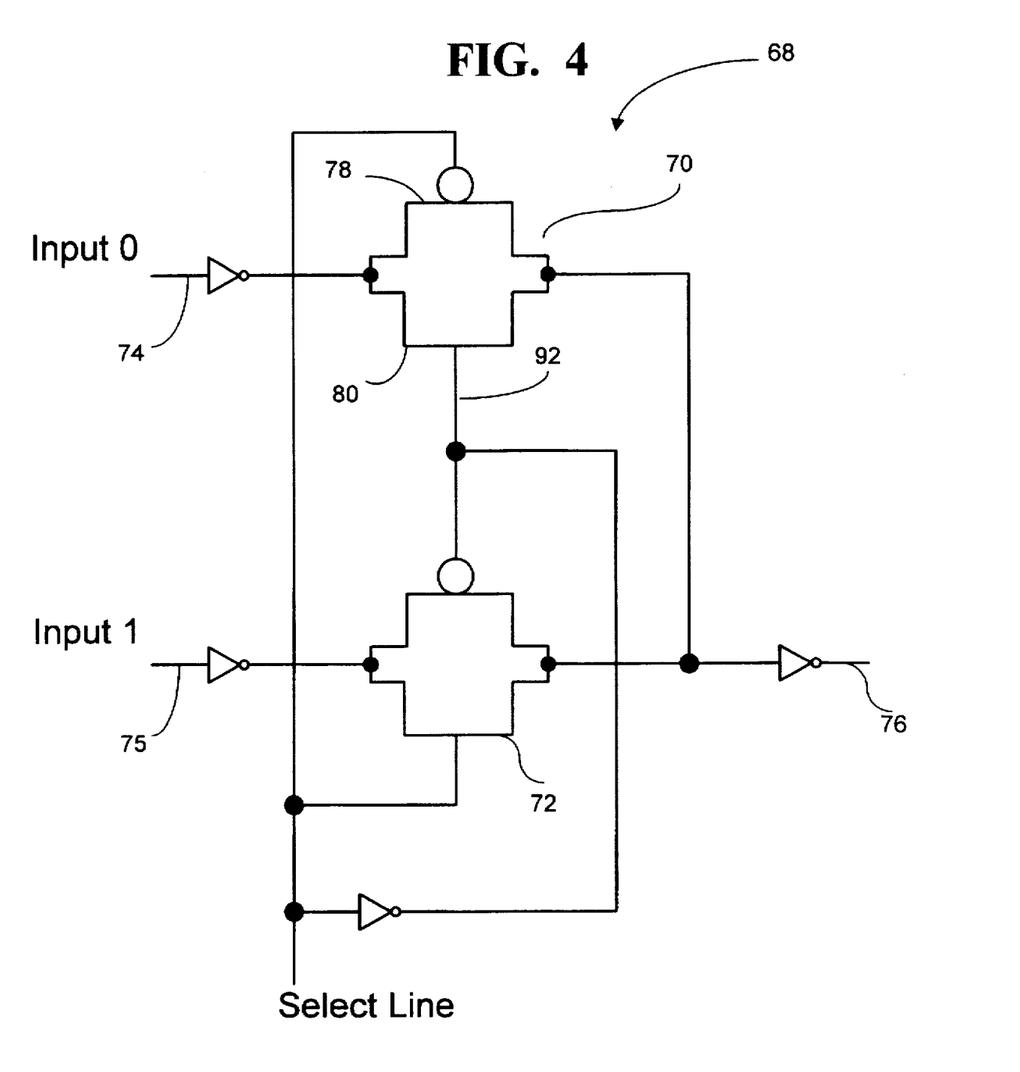
FIG. 4 is a circuit diagram of a two-input serial multiplexer implemented with transmission gates.

FIG. 4 shows a two-input serial multiplexer circuit 68 having two transmission gates 70 and 72, with each transmission gate coupled to separate inputs 74 and 75, respectively. The outputs of the transmission gates 70, 72 are coupled together to provide a circuit output 76. Each transmission gate 70, 72 includes a P-channel and an N-channel transistor coupled in parallel, such as P-channel transistor 78 and N-channel transistor 80. When the transmission gate 70 is activated, both transistors 78 and 80 are activated. Since P-channel transistors more efficiently transmit high-voltage level signals, and N-channel transistors more efficiently transmit low-voltage level signals, the parallel combination of the transistors 78, 80 together provide an efficient transmission means over a wide range of voltage levels.

Figure 5:
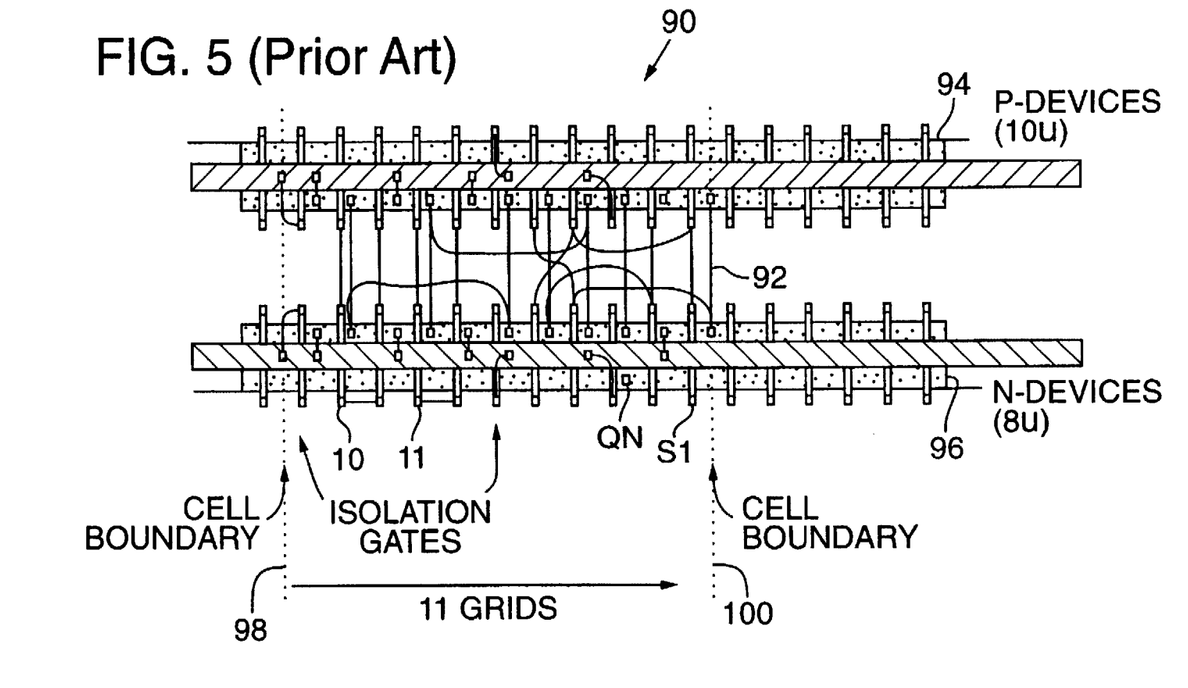
FIG. 5 shows a base row type having a single P-channel and a single N-channel transistor row interconnected to form the circuit of FIG. 4.

FIG. 5 shows the circuit of FIG. 4 implemented in a base row type similar to the one shown in FIG. 1B. The transistors are interconnected using lead lines, such as lead line 92 (also shown in its corresponding connection in FIG. 4). A P-type diffusion strip 94 and an N-type diffusion strip 96 are wide (8 microns and 10 microns, respectively) to allow for large transistors needed in standard components.

The circuit 68 of FIG. 4, however, includes several transmission gates 70, 72 that do not require large transistors. Consequently, there is waste associated with implementing transmission gates with large-sized transistors used in FIG. 5. Cell boundaries indicated at 98 and 100 are related to the total area the circuit uses. In this case, the circuit requires 11 grids (i.e., the width of eleven transistors).

Figure 6:
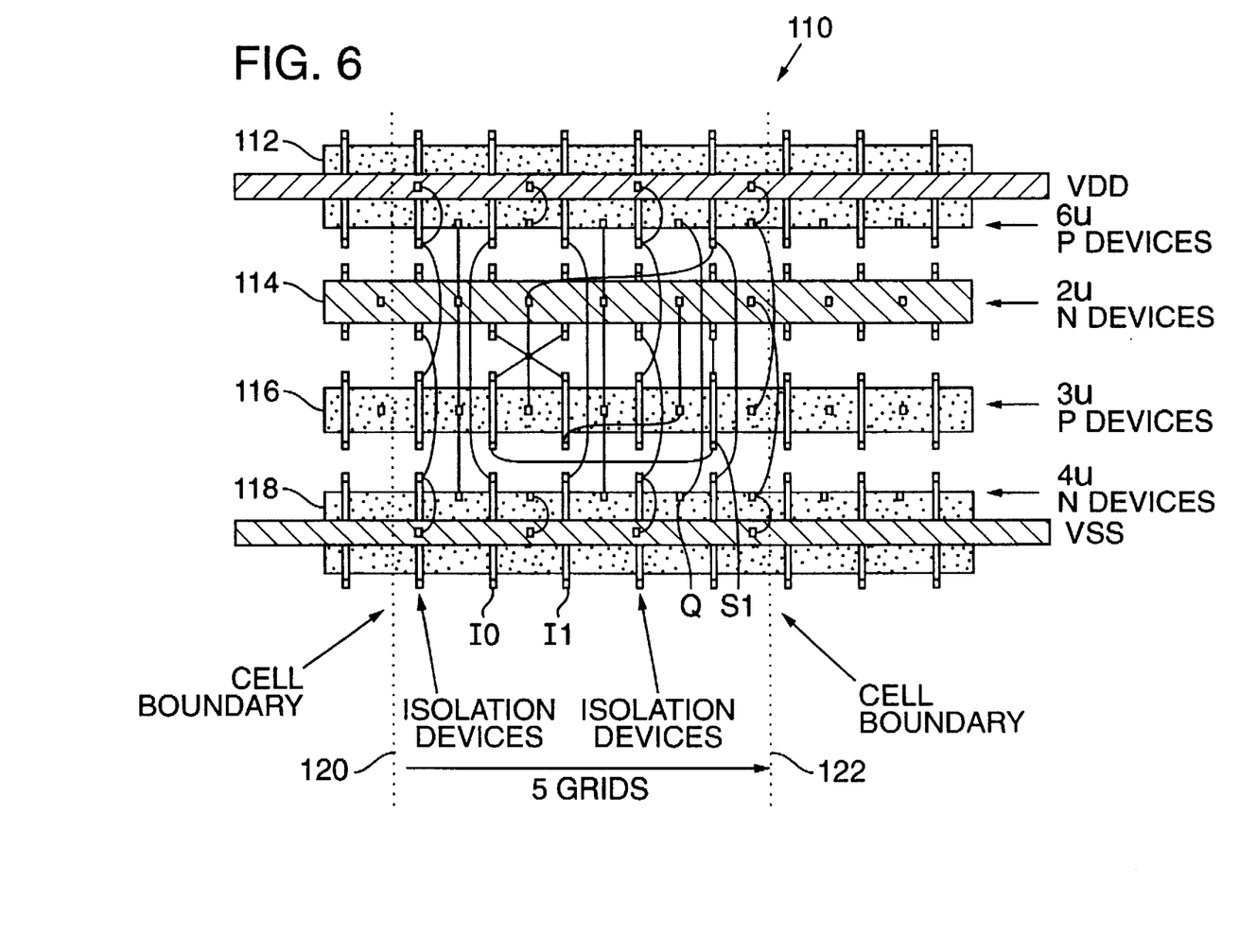
FIG. 6 shows a base row type having four rows of alternating P-type and N-type diffusion strips forming transistors that are interconnected to create the circuit of FIG. 4.

FIG. 6 shows the circuit 68 of FIG. 4 implemented in a gate array having a base row type 110 with four diffusion strips 112, 114, 116, and 118. The diffusion strips alternate between P- and N-type diffusions, and each diffusion strip is a different size. For example, an outer P-type diffusion strip 112 is six microns, and an outer N-type diffusion strip 118 is four microns. The inner diffusion strips 114 and 116 are two and three microns, respectively. As indicated by the cell boundaries 120 and 122, the width of the entire circuit is only five grids (i.e., the width of five transistors). This is a substantial savings over the base row of FIG. 5, which requires more than double that width. This savings is only for the small two-input circuit of FIG. 4. Over an entire gate array, the savings add up to a significant reduction in area used.

Figure 7:
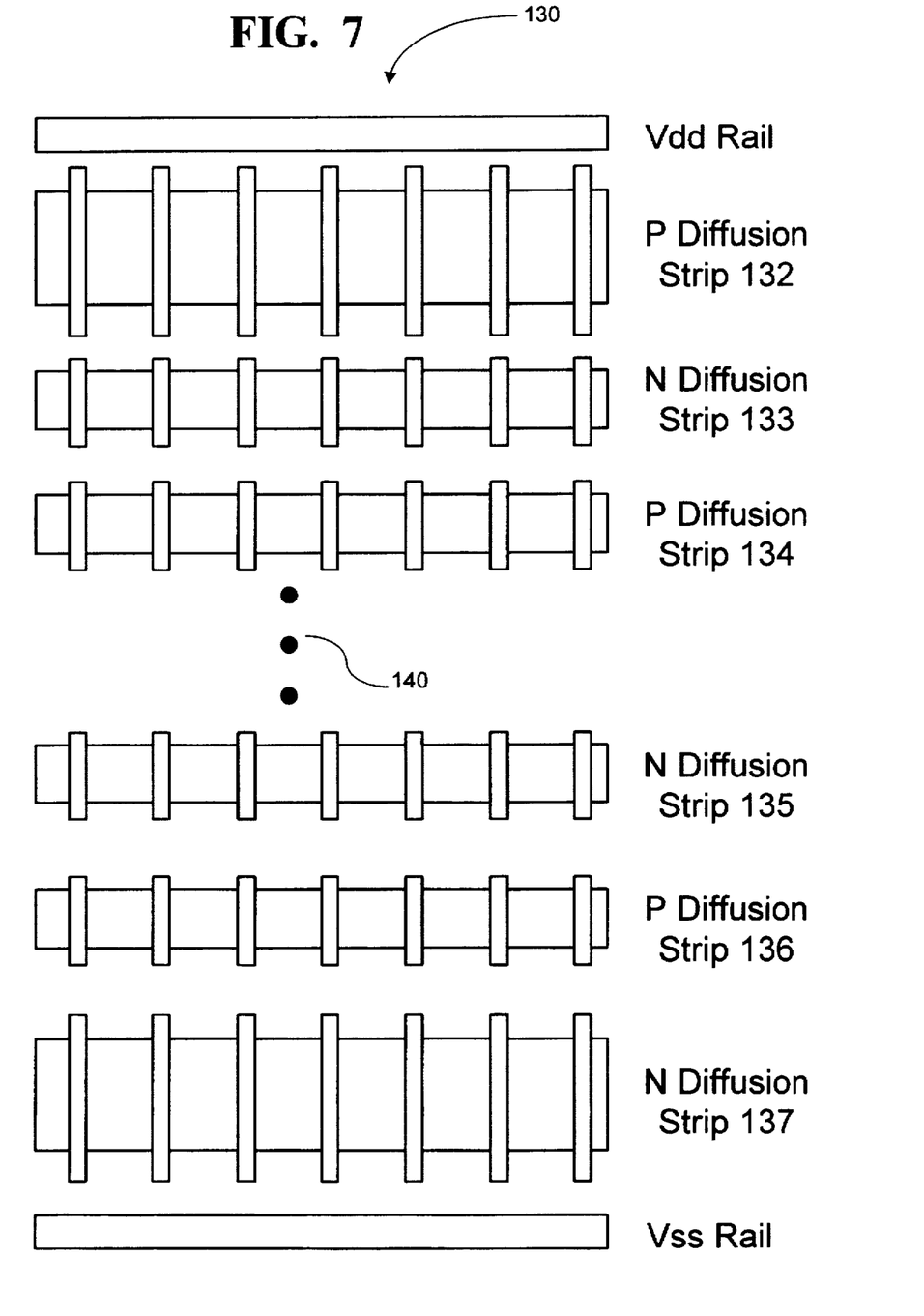
FIG. 7 shows a base row type that may be used in the gate array architecture of FIG. 1A with at least six rows of P- and N-channel transistors between voltage rails.

FIG. 7 shows another base row type 130 used in a gate array architecture. The base row type 130 includes at least six rows of alternating P- and N-type diffusion strips 132–137. Although the Vdd and Vss rails are shown outside of the outer diffusion strips 132 and 137, they may also overlap these diffusion strips, as was shown in FIG. 3B.

The base row type 130 includes four inner rows sized for use with transmission gates. As indicated by the dots 140, additional rows may be added if desired. For use with transmission gates, however, it is preferable to have an even number of rows because transmission gates are formed from one P-channel transistor and one N-channel transistor. Thus, the base row type 130 may contain 6, 8, or 10 rows of transistors, for example.

Figure 8:
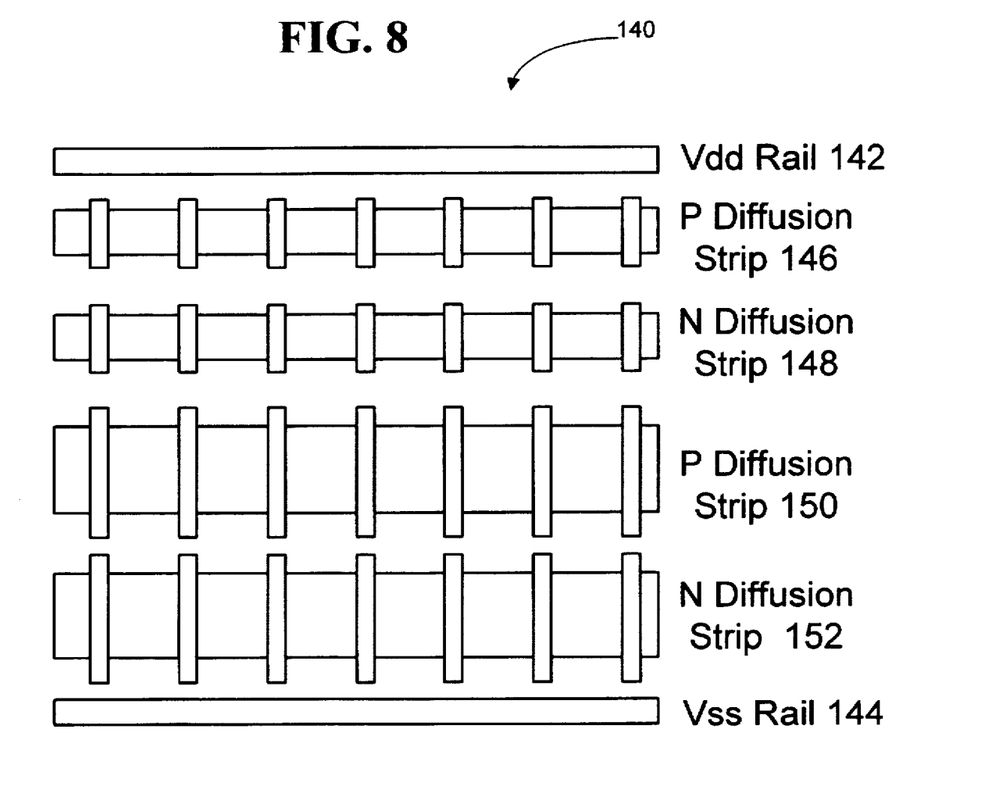
FIG. 8 shows a base row type that may be used in the gate array architecture of FIG. 1A with two smaller diffusion strips adjacent each other and two larger diffusion strips adjacent each other.

FIG. 8 shows another base row type 140 used in the gate array architecture. The base row type 140 includes two voltage rails 142 and 144 and four diffusion strips 146, 148, 150 and 152 that alternate between P- and N-channel diffusion strips. The two strips 146, 148 positioned nearest voltage rail 142 are sized for connecting transistors as transmission gates. The two strips 150, 152 positioned nearest voltage rail 144 are sized for connecting transistors as standard gates. Thus, the diffusion strips 150 and 152 are a first, larger size and the diffusion strips 146 and 148 are a second, smaller size. The base row type 140 may alternatively have two smaller sized diffusion strips adjacent the Vss voltage rail 144 and two larger sized diffusion strips adjacent the Vdd rail 142.

Having described and illustrated the principles of our invention with reference to preferred embodiments thereof, it will be apparent that these embodiments can be modified in arrangement and detail without departing from the principles of the invention.

For example, although voltage rails Vdd and Vss were described as positive power and ground rails, one skilled in the art will recognize that Vdd and Vss can be coupled to a source providing any desired voltage levels.

Additionally, when the transistor rows are described as being between the Vdd and Vss rails, the word "between" includes, minimally, the positioning of the Vdd and Vss rails outside of the outer diffusions as shown in FIG. 3A, or over the top of the outer diffusions as shown in FIG. 3B. A combination of these two versions can also be used.

Further, although the gate array architecture is shown for implementing transmission gate-based circuits, other circuits can be coupled using the described architecture. The architecture has no limitations in terms of what circuits can be created.

Yet still further, the present invention can be implemented in hardware or software. A software implementation could be on a CAD system or other circuit layout program or system.

Still further, the invention applies to all gate array architectures including, but not limited to, "sea-of-gates" architectures.

In view of the many possible embodiments to which the principles of our invention may be applied, it should be recognized that the illustrated embodiments are only examples of the invention and should not be taken as limitations on the scope of the invention. Rather, the invention is defined by the following claims. We therefore claim as our invention all such embodiments that come within the scope of these claims.

We claim:

1. A gate array architecture for use in a master wafer, comprising:

a base row including a first voltage rail and a second voltage rail and at least four rows of transistors between the voltage rails;

the rows of transistors including at least two P-channel transistor rows and at least two N-channel transistor rows which are parallel to the first and second voltage rails;

the rows of transistors in the base row alternating between P-channel and N-channel transistor rows so that two rows of transistors are adjacent to the voltage rails and at least two rows of transistors are spaced-apart from the voltage rails by a distance of one or more rows of transistors; and wherein the base row is one of a plurality of base rows forming the gate array architecture.

2. The gate array architecture of claim 1, wherein the P-channel transistor rows include transistors of a first size and the N-channel transistor rows include transistors of a second, different size.

3. The gate array architecture of claim 1 wherein the P-channel transistor rows include transistors that are equivalent in size to transistors in the N-channel transistor rows.

4. The gate array architecture of claim 1 wherein a first of the P-channel transistor rows includes transistors having a first size and a second of the P-channel transistor rows includes transistors having a second size.

5. The gate array architecture of claim 4 wherein a first of the N-channel transistor rows includes transistors having a third size and a second of the N-channel transistor rows includes transistors having a fourth size.

6. The gate array architecture of claim 1 wherein the transistor rows nearest the voltage rails are outer rows and the transistor rows between the outer rows are inner rows, and wherein the inner rows are sized for connection as transmission gates, and the outer rows are sized for connection as standard components.

7. The gate array architecture of claim 1 wherein the base row has four rows of transistors between the voltage rails, wherein:

a first row is a P-channel transistor row;

a second row is an N-channel transistor row;

a third row is a P-channel transistor row; and a fourth row is an N-channel transistor row.

8. The gate array architecture of claim 1 wherein the base row is repeated over a majority of the gate array architecture.

9. The gate array architecture of claim 1 wherein the base row includes six rows of transistors between voltage rails.

10. A gate array architecture for use in a master wafer, comprising:

a first voltage rail;

a second voltage rail;

a first P-type diffusion strip having a plurality of polysilicon gates coupled thereto forming a first row of transistors, the P-type diffusion strip being positioned adjacent the first voltage rail and between the first and second voltage rails;

a first N-type diffusion strip having a plurality of polysilicon gates coupled thereto forming a second row of transistors, the first N-type diffusion strip being positioned adjacent the second voltage rail and between the first and second voltage rails;

a second P-type diffusion strip having a plurality of polysilicon gates coupled thereto forming a third row of transistors, the second P-type diffusion strip positioned adjacent the first N-type diffusion strip and between the first N-type diffusion strip and the first P-type diffusion strip;

a second N-type diffusion strip having a plurality of polysilicon gates coupled thereto forming a fourth row of transistors, the N-type diffusion strip positioned between the first P-type diffusion strip and the second P-type diffusion strip; and wherein the first and second N-type diffusion strips and the first and second P-type diffusion strips are substantially parallel to each other and to the first and second voltage rails; and wherein there are no intervening voltage rails between the first and second voltage rails.

11. The gate array architecture of claim 10 wherein the first voltage rail is positioned on top of the first P-type diffusion strip and the second voltage rail is positioned on top of the first N-type diffusion strip.

12. The gate array architecture of claim 10 wherein the second N-type diffusion strip and the second P-type diffusion strip are sized smaller than the first N-type diffusion strip and the first P-type diffusion strip.

13. The gate array architecture of claim 10 wherein the third and fourth row of transistors are coupled together to form transmission gates.

14. The gate array architecture of claim 13 wherein the first and second row of transistors are coupled together to form inverters.

15. The gate array architecture of claim 10 wherein the first through fourth row of transistors are coupled to create serial multiplexer-based circuits.

16. A gate array device comprising a plurality of base rows of transistors, at least one of the base rows including first and second voltage rails and at least four rows of transistors between the rails, the four rows being parallel to the first and second voltage rails ad alternating between P-channel and N-channel transistors and having no other voltage rails between the first and second voltage rails.

* * * * *

UNITED STATES PATENT AND TRADEMARK OFFICE
CERTIFICATE OF CORRECTION

PATENT NO. : 5,780,883
DATED : July 14, 1998
INVENTOR(S) : Tran, et. al.

It is certified that error appears in the above-indentified patent and that said Letters Patent is hereby corrected as shown below:

Column 8, line 48, delete ad and insert --and--.

Signed and Sealed this

Nineteenth Day of October, 1999

Attest:

Q. TODD DICKINSON

Attesting Officer     Acting Commissioner of Patents and Trademarks